(12) United States Patent
Mittermaier et al.

(10) Patent No.: US 11,729,916 B2
(45) Date of Patent: Aug. 15, 2023

(54) SOLDERING AID FOR CONNECTING A CABLE TO A PRINTED CIRCUIT BOARD

(71) Applicant: MD ELEKTRONIK GmbH, Waldkraiburg (DE)

(72) Inventors: Gerd Mittermaier, Muehldorf am Inn (DE); Matthias Borkowski, Hebertsfelden (DE); Nikolaus Lechleitner, Ampfing (DE); Johann Friesinger, Rechtmehring (DE); Alexander Haas, Muehldorf am Inn (DE); Christian Stoemmer, Erding (DE); Martin Sterkel, Prien (DE); Lutz Rissing, Munich (DE)

(73) Assignee: MD ELEKTRONIK GMBH, Waldkraiburg (DE)

( * ) Notice: Subject to any disclaimer, the term of this patent is extended or adjusted under 35 U.S.C. 154(b) by 66 days.

(21) Appl. No.: 17/371,118

(22) Filed: Jul. 9, 2021

(65) Prior Publication Data

US 2022/0030722 A1    Jan. 27, 2022

(30) Foreign Application Priority Data

Jul. 23, 2020 (DE) ..................... 10 2020 119 422.6

(51) Int. Cl.
*H05K 1/18* (2006.01)
*H05K 1/11* (2006.01)
(Continued)

(52) U.S. Cl.
CPC ......... *H05K 3/3405* (2013.01); *H01R 12/515* (2013.01); *H05K 1/18* (2013.01); *H05K 1/11* (2013.01); *H05K 2201/10356* (2013.01)

(58) Field of Classification Search
CPC ............... H05K 3/3405; H05K 1/18; H05K 2201/10356; H05K 3/34; H05K 1/181;
(Continued)

(56) References Cited

U.S. PATENT DOCUMENTS 3,573,719 A * 4/1971 Lightner .............. H01R 12/777 439/494
4,225,205 A * 9/1980 Sinclair ................ H01R 12/777 439/499

(Continued)

FOREIGN PATENT DOCUMENTS

DE 10046489 C1 12/2001
DE 102008013226 A1 9/2009
(Continued)

*Primary Examiner* — Ishwarbhai B Patel
(74) *Attorney, Agent, or Firm* — Leydig, Voit & Mayer, Ltd.

(57) ABSTRACT

A soldering aid for connecting a cable to a printed circuit board includes an electrically insulating body having a first, second and third recesses, and an electrically conductive contact structure coupled thereto. The contact structure is partially embedded in the body to be connected to a cable core therein, and partially protrudes from the body to be connected the printed circuit board. The first recess is conically tapered to receive an end portion of the cable and has first and second sections for non-stripped and stripped portions of the cable end portion, respectively. An end of the second recess adjoins the second section of the first recess to enable optical verification of formation of a connection between the cable core and the contact structure. The third recess is configured to receive and transfer solder to the second section of the first recess to thereby form the connection.

14 Claims, 2 Drawing Sheets

(51) Int. Cl.
*H05K 3/34* (2006.01)
*H01R 12/51* (2011.01)
(58) Field of Classification Search
CPC .......... H05K 2201/10287; H05K 2201/10962; H01R 12/515; H01R 4/027; H01R 12/57; H01R 43/0263; H01R 12/53
See application file for complete search history.

(56) References Cited

U.S. PATENT DOCUMENTS

| | | | |
|---|---|---|---|
| 5,021,630 A | | 6/1991 | Benko et al. |
| 5,664,964 A | * | 9/1997 | Crofoot .............. H01R 13/5845 439/495 |
| 6,338,653 B1 | * | 1/2002 | Jones ................... H01R 12/598 439/579 |
| 10,237,971 B2 | * | 3/2019 | Takagi ................... H05K 1/028 |
| 2004/0231884 A1 | * | 11/2004 | Wong ..................... H05K 3/341 174/259 |
| 2019/0115683 A1 | | 4/2019 | Eberlein et al. |
| 2020/0203854 A1 | | 6/2020 | Tamura |

FOREIGN PATENT DOCUMENTS

| | | |
|---|---|---|
| DE | 102011076817 A1 | 12/2012 |
| DE | 102013215145 A1 | 2/2015 |
| DE | 102016223475 A1 | 6/2017 |
| DE | 102017218541 A1 | 4/2019 |
| EP | 3477798 A1 | 5/2019 |
| WO | WO 2009114225 A1 | 9/2009 |

\* cited by examiner

SOLDERING AID FOR CONNECTING A CABLE TO A PRINTED CIRCUIT BOARD

CROSS REFERENCE TO RELATED APPLICATION

This application claims benefit to German Patent Application No. DE 10 2020 119 422.6, filed on Jul. 23, 2020, which is hereby incorporated by reference herein.

FIELD

The invention relates to a soldering aid for connecting a cable to a printed circuit board. The invention further relates to a cable, a printed circuit board, and an assembly having such a soldering aid. Moreover, the invention relates to a method for connecting a cable to a printed circuit board using such a soldering aid.

Cables are used to couple electrical or electronic devices in signal transmission relationship and/or in energy transmission relationship to another apparatus. For this purpose, a printed circuit board carrying electrical/electronic components of the device has a suitable terminal that can be coupled to a cable end portion so that, for example, an electric current and/or a control signal and/or a communication signal can be transmitted between the device and the apparatus via the cable.

BACKGROUND

In the prior art, there are known a variety of ways to form an electrical connection by soldering.

DE 10 2008 013 226 A1 describes a soldered connection for attaching a surface mount device (SMD) via a contact surface to a solder paste disposed within a recess in the printed circuit board. In that publication, the printed circuit board must be suitably prepared and provided with the recesses.

U.S. Pat. No. 5,021,630 describes attaching an electronic device to a substrate using a glass plate that is heated by irradiation with a laser so that a solder melts.

With regard to the attachment of a cable core, EP 3 477 798 A1 describes a device for attaching a first cable core in a housing using a pressing mechanism that preliminarily secures the first cable core so that a second cable core can also be attached in the housing.

DE 100 46 489 C1 describes an electrical conductor on a carrier foil. The electrical conductor can be attached by soldering to a contact surface by means of a connecting element. An insert member includes a solder deposit and is configured as a crimp member. Melting of the solder may be accomplished by supplying heat by means of a laser.

SUMMARY

In an embodiment, the present invention provides a soldering aid for connecting a cable to a printed circuit board. The soldering aid includes an electrically insulating body having a first recess, a second recess, and a third recess, and an electrically conductive contact structure coupled to the body. The contact structure is partially embedded in the body so as to be connected to a cable core of the cable inside the body and partially protrudes from the body so as to be connected to a terminal of the printed circuit board. The first recess is conically tapered to receive an end portion of the cable and has a first section for a non-stripped portion of the cable end portion and a second section for a stripped portion of the cable end portion, the stripped portion of the cable end portion including the cable core, and the contact structure adjoining the second section. The second recess is spatially offset from the first recess, an end of the second recess adjoining the second section of the first recess so as to enable optical verification of formation of a connection between the cable core and the contact structure. The third recess is spatially offset from the first recess and from the second recess, an end of the third recess adjoining the second section of the first recess. The third recess is configured to receive solder and transfer the solder to the second section of the first recess so as to form the connection between the cable core and the contact structure at the second section of the first recess.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
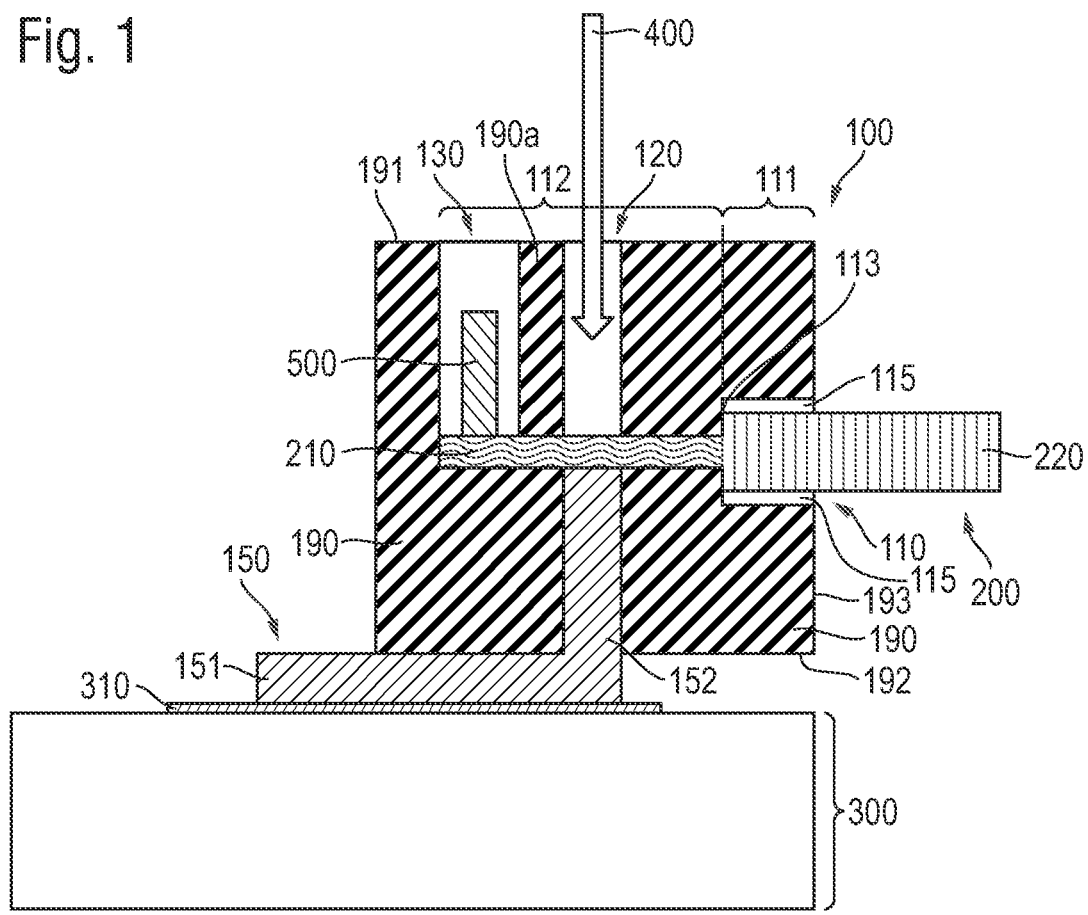
FIG. 1 is an exemplary schematic cross-sectional view of a portion of an assembly including a soldering aid according to a first embodiment.

Embodiments of the present invention simplify the formation of a soldered connection between a cable core (e.g., a stranded or solid core) of a cable and a terminal of a printed circuit board.

In accordance with a first embodiment, a soldering aid for connecting a cable to a printed circuit board includes an electrically insulating body having a first recess, a second recess, and a third recess, as well as an electrically conductive contact structure coupled to the body, the contact structure being partially embedded in the body so as to be connected to a cable core of the cable inside the body and partially protruding from the body so as to be connected to a terminal of the printed circuit board. The first recess is configured to receive an end portion of the cable and has a first section for a non-stripped portion of the cable end portion and a second section for a stripped portion of the cable end portion, the stripped portion of the cable end portion including the cable core, and the contact structure adjoining the second section. Particularly preferably, the first recess is tapered, in particular conically tapered; i.e., has a diameter that decreases toward the second recess. The second recess is spatially offset from the first recess, and the end thereof adjoins the second section of the first recess so as to enable optical verification of the formation of the connection between the cable core and the contact structure. The third recess is spatially offset from the first recess and from the second recess, and the end thereof adjoins the second section of the first recess, the third recess being configured to receive solder and transfer it to the second section of the first recess so as to thereby form the connection between the cable core and the contact structure.

In accordance with a second embodiment, a cable has attached to its end portion a soldering aid according to the first embodiment.

In accordance with a third embodiment, a printed circuit board has soldering aid according to the first embodiment attached to a terminal of the printed circuit board.

In accordance with a fourth embodiment, an assembly includes a cable and a printed circuit board, the cable and the printed circuit board being interconnected by a soldering aid according to the first embodiment.

In accordance with a fifth embodiment, a method for connecting a cable to a printed circuit board includes forming an electrically conductive connection between a cable core of the cable and a terminal of the printed circuit board using a soldering aid according to the first embodiment.

Several specific embodiments of the soldering aid are described hereinafter. The description is analogously applicable to the cable, the printed circuit board, the assembly, and to the method.

The body of the soldering aid has, for example, a top side, a bottom side, and a front side. The contact structure protrudes from the body at the bottom side so as to be connected to the terminal (e.g., a soldering pad) of the printed circuit board. This connection is produced, for example, by a soldering process, for example in a so-called reflow process.

The first recess is formed, for example, at the front side of the body and extends into the body in a direction parallel to the bottom side thereof.

The second recess and the third recess are formed, for example, at the top side of the body and extend into the body in a direction perpendicular to the bottom side thereof and in spaced-apart relationship to each other.

The three recesses are each produced, for example, by drilling operations and have a corresponding cylindrical shape.

In accordance with an embodiment, the second recess and the third recess extend parallel to each other, e.g., from the top side toward the bottom side of the body. The second recess and the third recess are offset from each other, for example, in the direction of the extension of the first recess. The space between the second recess and the third recess is filled by the material of the body.

The second recess and the third recess open into the second section of the first recess. The contact structure also adjoins this second section, e.g., in such a way that it extends a small amount into the second section of the first recess. In any case, the contact structure bounds the second section of the first recess in such a way that the solder material can come into electrically conductive contact with the contact structure in the second section of the first recess.

In accordance with an embodiment, the contact structure is configured as a profiled part having, e.g., a U- or L-shaped cross-sectional profile, or alternatively, a z-shaped or stepped cross-sectional profile, a first leg of the profiled part protruding from the body so that the first leg can be connected to the terminal of the printed circuit board, and a second leg of the profiled part adjoining the second section of the first recess so that the second leg of the profiled part can be electrically conductively connected to the cable core of the cable by means of the solder material disposed in the second section of the first recess.

In accordance with an embodiment, the second section of the first recess is reduced in cross section relative to the first section, and a step is formed at a transition between the first section and the second section of the first recess, the step corresponding to the difference in cross section The three recesses are positioned and dimensioned such that a sheath of the non-stripped portion of the cable end portion adjoins the step when the cable core of the stripped portion of the cable end portion in the second section of the first recess adjoins both the end of the second recess and the end of the third recess.

The body of the soldering aid is made from an electrically insulating material. To be able to withstand a soldering process, the body material is preferably also heat-resistant, for example, a thermosetting plastic. In an embodiment, the first recess for receiving the cable end portion is provided with a fastening means, e.g., a clamping mechanism, that fixes the cable end portion in the first recess after it is inserted therein. In order to form the clamping mechanism, the first recess is tapered, in particular conically tapered; in order to form the conical taper, the diameter of the first recess decreases toward the second recess or toward the third recess. The fastening means, in particular the conically tapered shape of the first recess, fixes the non-stripped portion of the cable end portion in the first section, for example, by the sheath of the cable end portion being clamped, gripped, locked, or otherwise secured in the first section.

The electrically conductive contact structure is made from copper bronze, for example. It may be monolithic in construction.

The cable may be a cable for transmitting an electrical current or a control or communication signal. The cable core is designed and dimensioned according to the respective requirements. The soldering aid in particular also enables connection of a cable core having a very small cross-sectional area, for example a cross-sectional area of less than about 0.35 mm2.

The terminal of the printed circuit board is formed, for example, by a soldering pad or the like. The term "printed circuit board" as used herein is to be understood broadly to cover any carrier of electrical/electronic components of which at least one is connected to the terminal via an electrically conductive coupling, such carriers including in particular also carriers which are not, in the strict sense, board-shaped. This coupling may include, for example, an integrated or laminated conductive trace.

In an embodiment, the above-described arrangement including the contact structure and the three recesses extending into the body is multiply implemented in the body of the soldering aid, so that a plurality of cable cores (even of different size) of one or more cables can be connected to the printed circuit board. For example, one or more data conductors as well as one or more power conductors of one single cable are connected via the soldering aid to corresponding terminals of a printed circuit board.

Because the second recess and the third recess adjoin, at their ends, the second section of the first recess, the cable core exposed by the stripped portion of the cable end portion in the second section of the first recess is accessible or visible via the second recess and the third recess.

The third recess holds the solder ready for use, and thus forms, for example, a solder deposit, it also being possible that the end portion of a solder wire may be inserted in the third recess. The solder can be liquefied by heat input and thus be connected to the contact structure in the second section of the first recess.

Heat input is accomplished, for example, by laser radiation, the laser beams being directed, for example, through the second recess in order to generate the heat as locally as possible in the second section of the first recess. The second recess thus allows to optically check, prior to the soldering process, in particular prior to the heating of the solder, whether the cable end portion is properly positioned with the cable core in the first recess. Furthermore, the second recess allows heat to be selectively coupled in during the soldering process or to effect the soldering process, and further allows to verify the formation of the connection after the soldering process.

Optionally, in addition to, or as an alternative to, the optical verification, the proper positioning of the cable core is checked using a force sensor that detects abutment of the cable sheath against the step of the first recess, for example, during insertion of the cable into the first recess.

In accordance with an embodiment of the method, all of the above-described steps regarding the formation of the soldered connection between the cable core and the contact structure and between the contact structure and the printed circuit board terminal are performed in an automated manner by suitable automated process machines.

In a preferred embodiment of the inventive method for connecting a printed circuit board to a cable, it is provided to first produce the soldered connection between the cable core and the contact structure inside the body of the soldering aid, for example in a reflow process, after the soldering aid has previously been positioned by a component placement machine (e.g., via pick and place) on the terminal of the printed circuit board, which terminal is provided with a solder paste for purposes of preliminary retention, and to subsequently produce the connection between the contact structure and the printed circuit board terminal. In this way, cables which have been pre-assembled using a soldering aid and are kept in stock as intermediate products can be quickly and cost-effectively connected to the printed circuit board as needed. In particular, the connection of the cables to the soldering aids can be carried out in parallel in terms of the process and with a small temporal offset from the attachment of the soldering aids to the printed circuit board. In an alternative embodiment, the connections are formed in reverse order; i.e., first the soldered connection between the contact structure and the printed circuit board terminal, and then the connection of the cable to the soldering aid. This alternative embodiment may avoid the need for the solder connection between the cable core and the contact structure inside the body to have to withstand any peculiarities of a process for connecting the contact structure to the printed circuit board terminal (e.g., a reflow process). Regardless of the sequence of process steps, provision is made to use a soldering aid having the features of an embodiment of the present invention.

Thus, the soldering aid described herein may advantageously perform various functions; e.g., providing guidance for the cable core, fixing the cable core in position, providing solder for the connection between the cable core and the contact structure inside the body, as well as optically checking the positioning of the cable core and the connection produced. Thus, for example, an advantageous wire-to-board soldering aid is provided by means of which a permanent, non-releasable connection can be created between the cable and printed circuit board.

Within the scope of the present invention, it is possible to use known metal alloys. Alternatively, electrically conductive adhesives may also be used as the solder material.

FIG. 1 shows exemplarily and schematically an assembly including a printed circuit board 300 and a cable 200. A cable core 210 of cable 200 is electrically connected to a terminal 310 of printed circuit board 300.

A soldering aid 100 is provided for connecting cable 200 to printed circuit board 300.

Soldering aid 100 includes an electrically insulating body 190 having a first recess 110, a second recess 120, and a third recess 130, as well as an electrically conductive contact structure 150 coupled to body 190.

Recesses 110, 120 and 130 are each configured as bores, in particular as blind-end bores.

Contact structure 150 is, for example, overmolded with body 190 and is made, for example, from copper bronze or another material having good conductivity. In the two embodiments shown, contact structure 150 is of single-piece construction.

Body 190 is made from a heat-resistant material, e.g., a thermosetting plastic or another plastic.

Contact structure 150 is partially accommodated in body 190, in particular captively connected to the material of body 190 within body 190 by being partially overmolded or encapsulated with the material of the body 190, so as to be connected to cable core 210 of cable 200 inside body 190. It is further provided that contact structure 150 partially protrude from body 190 so as to be connected, in particular electrically conductively connected, to terminal 310 of printed circuit board 300. Both connections, namely the connection of cable core 210 of cable 200 to contact structure 150 and the connection of contact structure 150 to terminal 310 of the printed circuit board, may be made using a soldering process, as will be described below.

First recess 110 receives an end portion of cable 200 and includes a first section 111 for a non-stripped portion of the cable end portion and a second section 112 for a stripped portion of the cable end portion.

The stripped portion of the cable end portion includes cable core 210 of cable 200, the cable core 210 being exposed as a result of the stripping process and being received in second section 112 of first recess 110. Contact structure 150 adjoins second section 112 in such a way that solder material which has entered second section 112 comes into electrically conductive contact with contact structure 150.

Second recess 120 is spatially offset from first recess 110, and the end thereof adjoins second section 112 of first recess 110 so as to enable optical verification of the formation of the connection between cable core 210 and contact structure 150. Between second recess 120, which is configured as a blind-end bore, and third recess 130, which is also configured as a blind-end bore, there remains a portion 190a of body 190, portion 190a spacing the two recesses 120 and 130 apart. In the region of this portion 190a, the material thickness of body 190 is not reduced. Portion 190a prevents stray radiation from passing from one recess into the other. The two recesses 120, 130, which are each configured as blind-end bores, lead or open into first recess 110, which is also configured as a blind-end bore.

Third recess 130 is spatially offset from first recess 110 and from second recess 120, and the end thereof adjoins second section 112 of first recess 110, the third recess being configured to receive solder 500 and transfer it to second section 112 of first recess 110 so as to thereby form the connection between cable core 210 and contact structure 150.

Body 190 of soldering aid 100 has a top side 191, a bottom side 192, and a front side 193. Contact structure 150 protrudes from body 190 at the body's bottom side 192 so as to be there connected to terminal 310 of printed circuit board 300.

First recess 110 is formed at the body's front side 193 and extends into body 190 in a direction parallel to the body's bottom side 192.

Second recess 120 and third recess 130 are formed at the body's top side 191 and extend into body 190 in a direction perpendicular to the body's bottom side 192 and in spaced-apart relationship to each other.

Recesses 110, 120 and 130 are each configured, for example, as bores and have a substantially cylindrical outer shape with a substantially circular cross-sectional contour. Each of the bores is configured as a blind-end bore or blind bore, the bore walls surrounding the respective first or second recess 120, 130 around the entire circumference thereof. The end of second recess 120 and the end of third recess 130 lead into the side wall of first recess 110, so that second recess 120 and third recess 130 merge into first recess 110 in the region of second section 112. The transition from second recess 120 to first recess 110 is designed such that an optical inspection beam, for example, a laser beam directed along the axis of second recess 120, can sense the cable core 210 received in first recess 110. Furthermore, the transition from third recess 130 to first recess 110 is designed such that liquefied solder 500 can pass from the solder deposit received in third recess 130 to first recess 110 so as to wet cable core 210 in first recess 110.

In the exemplary embodiments shown, second recess 120 and third recess 130 extend substantially parallel to each other and, more specifically, from the body's top side 191 toward the body's bottom side 192. Second recess 120 and third recess 130 are offset and spaced apart from each other in the direction of the extension of first recess 110 and separated by portion 190a of body 190. The material of body 190 remaining between second recess 120 and third recess 130 forms the portion 190a that spaces second recess 120 and third recess 130 apart, so that the solder deposit and the inspection beam provided for sensing cable core 210 are spatially separated.

Second recess 120 and third recess 130 open into second section 112 of first recess 110; i.e., second recess 120 and third recess 130 each merge into second section 112 of first recess 110. Contact structure 150 also adjoins this second section 112, so that contact structure 150 bounds and closes second section 112 of first recess 110 toward bottom side 192 of body 190. It may, in particular, be provided that contact structure 150 extend a small amount into second section 112 of first recess 110.

Because second recess 120 and third recess 130 open and merge at their ends into second section 112 of first recess 110, the cable's cable core 210 in second section 112 of first recess 110, which has been exposed by stripping the end portion of the cable, is accessible and optically visible through second recess 120 and third recess 130, respectively.

Figure 2:
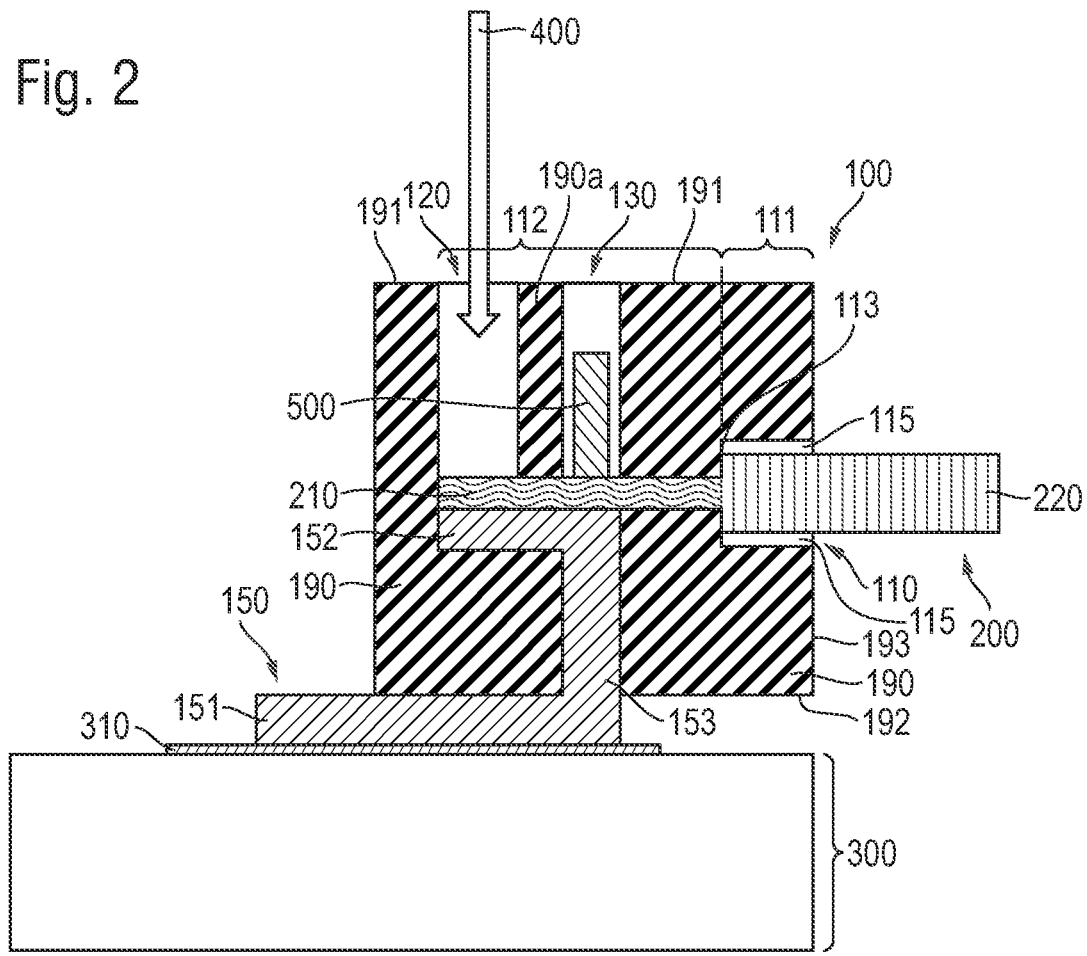
FIG. 2 is an exemplary schematic cross-sectional view of a portion of an assembly including a soldering aid according to a second embodiment.

Contact structure 150 has a profiled shape, e.g., a U-shape, as illustrated in FIG. 2, or an L-shape, as illustrated in FIG. 1.

A first leg 151 of contact structure 150 protrudes from body 190 and is connected to terminal 310 of printed circuit board 300. A second leg 152 of contact structure 150 adjoins second section 112 of first recess 110 and is there connected to cable core 210 of cable 200.

In the example of FIG. 1, second leg 152 is formed by a portion of the L-shaped contact structure 150, and in the example of FIG. 2, second leg 152 is formed by a portion of the U-shaped contact structure 150 and connected to first leg 151 by a web 153.

In both examples, second section 112 of first recess 110 is reduced in cross section relative to first section 111, and a step 113 is formed at a transition between first section 111 and second section 112 of first recess 110, the step corresponding to the difference in cross section. The three recesses 110, 120 and 130 are positioned and dimensioned such that a sheath 220 of the non-stripped portion of the cable end portion adjoins step 113 when the cable core 210 of the stripped portion of the cable end portion in second section 112 of first recess 110 adjoins both the end of second recess 120 and the end of third recess 130, as illustrated.

Further, first recess 110 for receiving the cable end portion is provided with a clamping means 115 (shown only schematically) that fixes the sheath 220 of the cable end portion in first section 111 after insertion into first recess 110.

Terminal 310 of printed circuit board 300 is formed by a soldering pad.

The following is a description of an exemplary method which allows cable core 210 to be connected to terminal 310 (soldering pad).

First, cable 200 is inserted into first recess 110. The proper positioning of cable 200 is optically checked. For the purposes of optically checking the positioning, both second recess 120 and third recess 130 or only one of these recesses 120, 130 may be used.

Once filled with solder 500, third recess 130 holds it ready for use (e.g., as a solder preform) and thus forms, for example, a solder deposit, it also being possible that the end portion of a solder wire may be inserted in third recess 300. Solder deposit 500 is, for example, mechanically fixed by clamping prior to insertion of cable core 210. Alternatively, the solder deposit may be provided as an adhesive paste, such as is known for use in SMD placement. Solder 500 is liquefied by heat input, flows to the soldering point, and electrically conductively connects contact structure 150 to cable core 210 in second section 112 of first recess 110. Due to the flow, solder 500 may also rise a certain amount in second recess 120, for example through the action of capillary forces. The rise of solder 500 in the second recess may, for example, be optically detected.

Heat input is accomplished, for example, by laser radiation, the laser beams (see reference numeral 400 in FIGS. 1 and 2) being directed, for example, through second recess 120 in order to produce the heat as locally as possible in second section 112 of first recess 110. Second recess 120 thus allows to optically check, prior to the soldering process, whether the cable end portion is properly positioned with cable core 210 in first recess 110, to selectively couple in heat during the soldering process or to effect the soldering process, and to sense, after the soldering process, the formation of the connection of the solder to cable core 210 in first recess 110.

In order to prevent cable sheath 220 in first section 111 of first recess 110 from being damaged by the generated heat, it is provided to position second recess 120 at a greater distance from first section 111 of first recess 110 than third recess 130, as illustrated in FIG. 2. Accordingly, it may be useful to extend the contact surface of contact structure 150, which is achieved by the U-shaped profile.

All of the above-described steps regarding the formation of the soldered connection between cable core 210 and contact structure 150 and between contact structure 150 and printed circuit board terminal 310 may be performed in an automated manner by suitable automated process machines.

Advantageously, the connection between contact structure 150 and printed circuit board terminal 310 is produced first, for example in a reflow process, after soldering aid 100 has previously been positioned by a component placement machine (e.g., via pick and place) on terminal 310 of printed circuit board 300, which terminal 310 is provided with a solder paste for purposes of preliminary retention, and subsequently the connection between cable core 210 and contact structure 150 is produced inside body 190 of soldering aid 100. This avoids the need for the solder connection between cable core 210 and contact structure 150 inside body 190 to have to withstand the possibly high temperatures during a reflow process for connecting contact structure 150 to printed circuit board terminal 310.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A soldering aid for connecting a cable to a printed circuit board, the soldering aid comprising:
   an electrically insulating body having a first recess, a second recess, and a third recess; and
   an electrically conductive contact structure captively connected to material within the body, the contact structure being partially embedded in the body so as to be connected to a cable core of the cable inside the body and partially protruding from the body so as to be connected to a terminal of the printed circuit board, wherein:
   the first recess is conically tapered to receive an end portion of the cable and has a first section for a non-stripped portion of the cable end portion and a second section for a stripped portion of the cable end portion, the stripped portion of the cable end portion including the cable core, and the contact structure adjoining the second section;
   the second recess is spatially offset from the first recess, an end of the second recess adjoining the second section of the first recess so as to enable optical verification of formation of a connection between the cable core and the contact structure; and
   the third recess is spatially offset from the first recess and from the second recess, an end of the third recess adjoining the second section of the first recess, the third recess being configured to receive solder and transfer the solder to the second section of the first recess so as to form the connection between the cable core and the contact structure at the second section of the first recess.

2. The soldering aid as recited in claim 1, wherein the body has a top side, a bottom side, and a front side, and wherein:
   the contact structure protrudes from the body at the bottom side so as to be connected at the bottom side to the terminal of the printed circuit board;
   the first recess is formed at the front side of the body and extends into the body in a direction parallel to the bottom side of the body; and
   the second recess and the third recess are formed at the top side of the body and extend into the body in a direction perpendicular to the bottom side of the body and in spaced-apart relationship to each other.

3. The soldering aid as recited in claim 1, wherein the second recess and the third recess extend parallel to each other.

4. The soldering aid as recited in claim 1, wherein the contact structure has a profiled shape, a first leg of the contact structure protruding from the body and a second leg of the contact structure adjoining the second section of the first recess.

5. The soldering aid as recited in claim 4, wherein the contact structure is U-shaped, L-shaped, Z-shaped or stepped in configuration.

6. The soldering aid as recited in claim 1, wherein:
   the second section of the first recess is reduced in cross section relative to the first section, and a step is formed at a transition between the first section and the second section of the first recess, the step corresponding to the difference in cross section; and
   the first, second and third recesses are positioned and dimensioned such that a sheath of the non-stripped portion of the cable end portion adjoins the step in a state in which the cable core of the stripped portion of the cable end portion in the second section of the first recess adjoins both the end of the second recess and the end of the third recess.

7. The soldering aid as recited in claim 1, wherein the contact structure is captively connected to the material within the body by being partially overmolded or encapsulated with the material of the body.

8. The soldering aid as recited in claim 1, wherein the third recess includes a solder deposit.

9. The soldering aid as recited in claim 1, wherein the first, second and third recesses are blind-end bores.

10. The soldering aid as recited in claim 1, wherein the body has a one-piece construction.

11. A cable having the soldering aid according to claim 1, wherein the soldering aid is attached to an end portion of the cable.

12. A printed circuit board having the soldering aid according to claim 1, wherein the soldering aid is attached to a terminal of the printed circuit board.

13. An assembly comprising the soldering aid according to claim 1, a cable and a printed circuit board, wherein the cable and the printed circuit board are interconnected by the soldering aid.

14. A method for connecting a printed circuit board to a cable using the soldering aid according to claim 1, the method comprising:
   forming an electrically conductive connection between a cable core of the cable and a terminal of the printed circuit board using the soldering aid.

* * * * *